(12) United States Patent
Blacksberg et al.

(10) Patent No.: US 7,800,040 B2
(45) Date of Patent: Sep. 21, 2010

(54) METHOD FOR GROWING A BACK SURFACE CONTACT ON AN IMAGING DETECTOR USED IN CONJUNCTION WITH BACK ILLUMINATION

(75) Inventors: Jordana Blacksberg, La Canada, CA (US); Michael Eugene Hoenk, Valencia, CA (US); Shouleh Nikzad, Valencia, CA (US)

(73) Assignee: California Institute of Technology, Pasadena, CA (US)

( * ) Notice: Subject to any disclaimer, the term of this patent is extended or adjusted under 35 U.S.C. 154(b) by 99 days.

(21) Appl. No.: 11/859,470

(22) Filed: Sep. 21, 2007

(65) Prior Publication Data

US 2008/0111056 A1     May 15, 2008

Related U.S. Application Data

(60) Provisional application No. 60/919,781, filed on Mar. 23, 2007, provisional application No. 60/846,386, filed on Sep. 21, 2006.

(51) Int. Cl.
*H01L 27/00* (2006.01)
(52) U.S. Cl. ............. 250/208.1; 250/214.1; 250/214 R; 257/290; 257/447; 438/72; 438/73
(58) Field of Classification Search ............. 250/208.1, 250/214 R; 257/447, 290; 438/72–73
See application file for complete search history.

(56) References Cited

U.S. PATENT DOCUMENTS

| | | | |
|---|---|---|---|
| 5,376,810 A | 12/1994 | Hoenk et al. | 257/228 |
| 5,912,500 A * | 6/1999 | Costello et al. | 257/434 |
| 6,025,585 A | 2/2000 | Holland | 250/208.1 |
| 6,107,619 A | 8/2000 | Cunningham et al. | 250/208.1 |
| 6,259,085 B1 | 7/2001 | Holland | 250/208.1 |
| 6,278,119 B1 | 8/2001 | Nikzad et al. | 250/371 |
| 6,346,700 B1 | 2/2002 | Cunningham et al. | 250/214.1 |
| 6,403,963 B1 * | 6/2002 | Nikzad et al. | 250/370.01 |
| 6,489,992 B2 * | 12/2002 | Savoye | 348/340 |
| 2005/0109918 A1 | 5/2005 | Nikzad et al. | 250/208.1 |
| 2006/0043436 A1 * | 3/2006 | Fan et al. | 257/290 |
| 2006/0043569 A1 * | 3/2006 | Benson et al. | 257/698 |

OTHER PUBLICATIONS

Blacksberg et al., "Ultra-low-temperature homoepitaxial growth of Sb-doped silicon," Journal of Crystal Growth, Elsevier B.V, 2005.
Blacksberg et al., "Enhanced quantum efficiency of high-purity silicon imaging detectors by ultralow temperature surface modification using Sb doping," Applied Physics Letters 87, 254101, American Institute of Physics, 2005.

* cited by examiner

*Primary Examiner*—Georgia Y Epps
*Assistant Examiner*—Kevin Wyatt
(74) *Attorney, Agent, or Firm*—Zilka-Kotab, PC

(57) ABSTRACT

A method is provided for growing a back surface contact on an imaging detector used in conjunction with back illumination. In operation, an imaging detector is provided. Additionally, a back surface contact (e.g. a delta-doped layer, etc.) is grown on the imaging detector utilizing a process that is performed at a temperature less than 450 degrees Celsius.

17 Claims, 5 Drawing Sheets

METHOD FOR GROWING A BACK SURFACE CONTACT ON AN IMAGING DETECTOR USED IN CONJUNCTION WITH BACK ILLUMINATION

RELATED APPLICATION(S)

The present application claims the benefit of a provisional application filed on Sep. 21, 2006 under application Ser. No. 60/846,386, which is incorporated herein by reference in its entirety for all purposes. The present application further claims the benefit of a provisional application filed on Mar. 23, 2007 under application Ser. No. 60/919,781, which is incorporated herein by reference in its entirety for all purposes.

STATEMENT REGARDING FEDERALLY SPONSORED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The present invention relates to imagers, and more particularly to increasing an operational range of imagers.

BACKGROUND

Large format arrays of imaging detectors have an increasing need to exhibit high sensitivity and low dark current, while operating under very low light level conditions. In addition, many imaging systems require detectors with a broad spectral range, facilitating large focal plane arrays that can cover a wide range of the spectrum in a single detector type.

Conventional imaging devices are illuminated from the front surface of the device, where the front surface is normally defined as the surface that has metal and gate structures used for manipulating charge. Such structures are necessary for the imaging device to function. However, the structures include relatively thick materials which correspond to undesired effects such as absorbing and scattering incident light and/or particles. The front surface gate structures normally use insulators (e.g. thermally grown silicon oxides) which are transparent and relatively benign for light, but absorb low energy particles and deep UV light.

The front surface gate structures also include gates, normally made of polycrystalline silicon, which have stronger absorption. Additionally, the gate structures include metals, which absorb and scatter strongly, but are designed to cover only a small portion of the surface. One way to avoid unpleasant effects of the front surface structures is to turn the imaging device over and illuminate from the back surface. In this way, light can theoretically get into the silicon detector, without having to go through the front surface. The process of illuminating a device from the back surface is called back illumination.

For most silicon detectors, back illumination immediately runs into a problem that is related to the materials used in making the device. Most devices use a relatively pure silicon for the light-sensitive region of the detector. This is normally accomplished by starting with a wafer including a substrate on which has been grown an "epilayer."

The "epilayer" is an epitaxially grown layer of high quality silicon. Except in the special case of high purity silicon detectors, the substrate is generally highly-doped. In most instances, but not all, the substrate is p++ silicon, while the epilayer includes p− silicon (e.g. doped at a few times $10^{14}$ dopants per cubic centimeter). In general, the highly doped substrate is at least an order of magnitude thicker than the epilayer, and the substrate absorbs most if not all of the incident light.

Thus, simply turning the detector over does not work because the substrate absorbs all of the light. One way to minimize the absorption is to remove the substrate using a thinning process. The thinning process exposes the back surface of the epilayer to incident light, so that light may get into the detector. Unfortunately, using the thinning process to expose the back surface of the epilayer is not enough.

After light and/or particles get into the detector, electron-hole pairs are formed, and it is the electron-hole pairs that are detected. Shallow penetrating radiation generates electron-hole pairs near the surface, and deep penetrating radiation generates electron-hole pairs through a much larger volume of the detector. Often, the internal structure of the detector prevents collecting charge generated by the shallow penetrating radiation. The observation that shallow penetrating radiation (e.g. photons or particles) is more difficult to detect than deeper penetrating radiation such as red light is sometimes referred to as a "dead layer."

After the substrate is removed using the thinning process, a bare silicon surface is left. The silicon is relatively pure because it is part of the epilayer. This purity allows free electrons and holes to have much longer lifetimes in pure material than in highly doped material. However, using relatively pure silicon creates a problem for the as-thinned detectors.

Silicon surfaces have surface-related defects. These defects are electrically active as they are able to trap charge in "mid-gap" states. These mid-gap states cause many problems. For example, the mid-gap states are rapidly filled by charge from the underlying silicon and a surface charge is generated. With a p-type epilayer, the surface gains a positive charge, and with an n-type epilayer, the surface gains a negative charge.

This charge creates an electric field inside the semiconductor, which penetrates into the semiconductor a certain distance before it is finally shielded by charge in the silicon lattice. The region in which this electric field exists is called the "backside potential well." Such backside potential well causes many problems for the detector.

First, the polarity of the charge is such that the backside potential well traps all of the signal charge that is to be detected. Second, the signal charge can contribute to the shielding properties of the semiconductor such that the backside potential well is unstable. In other words, the depth to which the electric field penetrates into the silicon varies with illumination history, temperature, and, unfortunately, the environment. Thus, even deeper penetrating radiation, which the detector can still see, is detected with an efficiency that changes with time and prior illumination. This phenomenon is called quantum efficiency hysteresis.

To solve these problems, something has to be done to the back surface to "passivate" the defects or to prevent the bad effects from occurring. There are various ways of passivating the back surface, including ion implantation/laser anneal and flash gate processes. In addition, delta-doping may be utilized.

Detectors with p−− epilayers, and n-type buried channels, are collecting the electrons in "electron-hole pairs." However, some detectors collect the holes in "electron-hole pairs." Such detectors are made with an n-- substrate, with a p-type buried channel. One such detector is the high purity CCD developed by Lawrence Berkeley National Laboratory (LBNL), for astrophysics applications.

Infrared sensitivity in silicon detectors is limited by the fact that infrared light penetrates so deeply into the silicon detector that some of the light is transmitted through the entire thickness of the detector and is lost. To avoid this problem, a thicker detector may be utilized to absorb more of the infrared light. However, thicker detectors include mainly "field-free" silicon. In other words, charge generated far from the front surface of the detector is shielded from fields generated by front-surface electrodes by the thick silicon. Thus, the deeper signal charge may simply diffuse around and end up anywhere.

Charge diffusion leads to fuzzy images, which is undesirable in scientific detectors. To fix that problem, a method is used for depositing an electrical contact on the back surface of the detector, and then applying a voltage to bias the detector into a condition known as "full depletion." A fully-depleted detector has an electric field throughout the entire thickness of the device. In a fully-depleted detector, charge generated anywhere in the detector is driven by an electric field toward the collection well near the front surface, where it is supposed to go. In this way, a 250 micron detector with 10 micron pixels may begin to approach high resolution imaging.

Full-depletion is useful for thick, high purity detectors, but it requires an electrode on the back surface. The electrode has to have certain properties in order to work well such as adequate conductivity, transparency (i.e. the electrode should not absorb or scatter light), and a low "dark current" (i.e. not a significant source of "dark current"), etc.

A process was developed for making the back surface electrode out of "in situ doped polysilicon" (ISDP). With some development, electrodes were able to be made with acceptable properties. However, the ISDP electrode is deposited at a substrate temperature of about 600° C., which is too high a temperature for a detector with aluminum metallization. At temperatures above 450° C., the aluminum starts to react with the underlying silicon, which destroys the detector.

Therefore, in order to use the ISDP electrode process, a detector manufacturer (e.g. a CCD manufacturer) must interrupt the manufacturing process before the metal layers are deposited. The partially-processed detectors (e.g. CCD wafers) may then be shipped to a location where the detectors may be thinned (e.g. because the original wafers are too thick to be fully depleted) in order to achieve a thickness of about 250 microns. The ISDP layer may then be grown on the back surface, and the metallization and the rest of the manufacturing process may be completed. However, interrupting the detector fabrication process is burdensome and inefficient. There is thus a need for addressing these and/or other issues associated with the prior art.

FIG. 1A shows a method 100 for growing a back surface contact on an imaging detector, in accordance with the prior art. As shown, manufacturing of an imaging device is started. See operation 102. Before the image device is metallized as part of the manufacturing, the manufacturing process is interrupted. See operation 104.

A substrate of the imaging device is then thinned to around 250 microns. See operation 106. A delta-doped layer is then grown on a back surface of the imaging device at a temperature of at least 600° C. See operation 108. Once the delta-doped layer is grown on the back surface of the imaging device, the imaging device may be metallized and the manufacturing of the imaging device may be completed. See operation 110.

Because the delta-doped layer is deposited at a substrate temperature of at least 600° C., the manufacturing of the imaging detector must be interrupted so that, in the case the metallization includes providing an aluminum electrode, the aluminum may start to react with the underlying silicon, destroying the detector. In some cases, the partially processed detectors may be shipped to a location where the detectors may be thinned and the delta-doped layer may be deposited. Once the thinning has occurred and the delta-doped layer is grown, the imaging device is allowed to cool to an acceptable temperature such that aluminum metallization may occur at a temperature of less than 450° C. It should be noted that this may involve shipping the imaging device back to the manufacturer to complete the manufacturing.

SUMMARY

A method is provided for growing a back surface contact on an imaging detector used in conjunction with back illumination. In operation, an imaging detector is provided. Additionally, a back surface contact (e.g. a delta-doped layer, etc.) is grown on the imaging detector utilizing a process that is performed at a temperature less than 450 degrees Celsius.

DETAILED DESCRIPTION

Figure 1A:
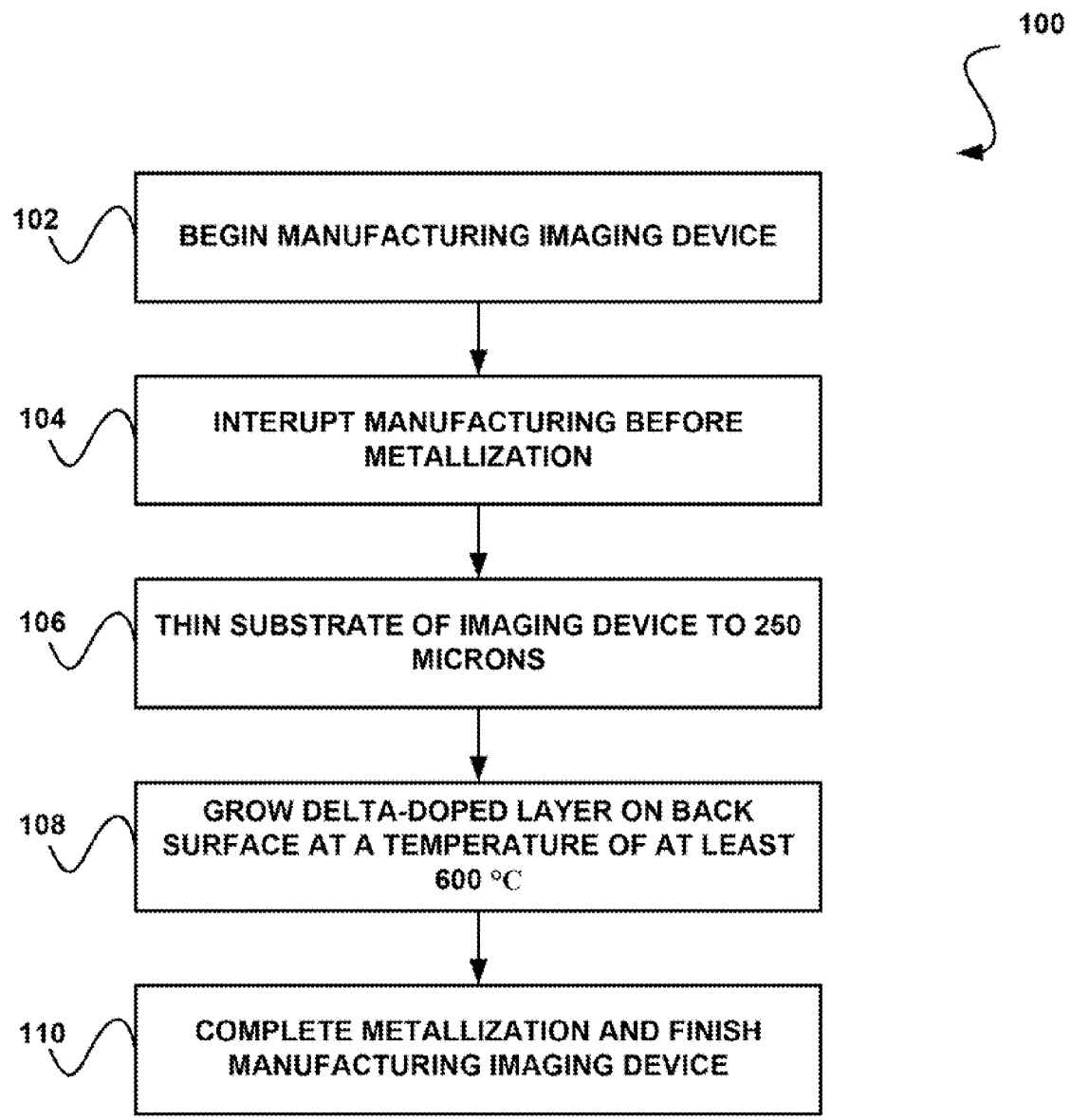
FIG. 1A shows a method for growing a back surface contact on an imaging detector, in accordance with the prior art.
Figure 1B:
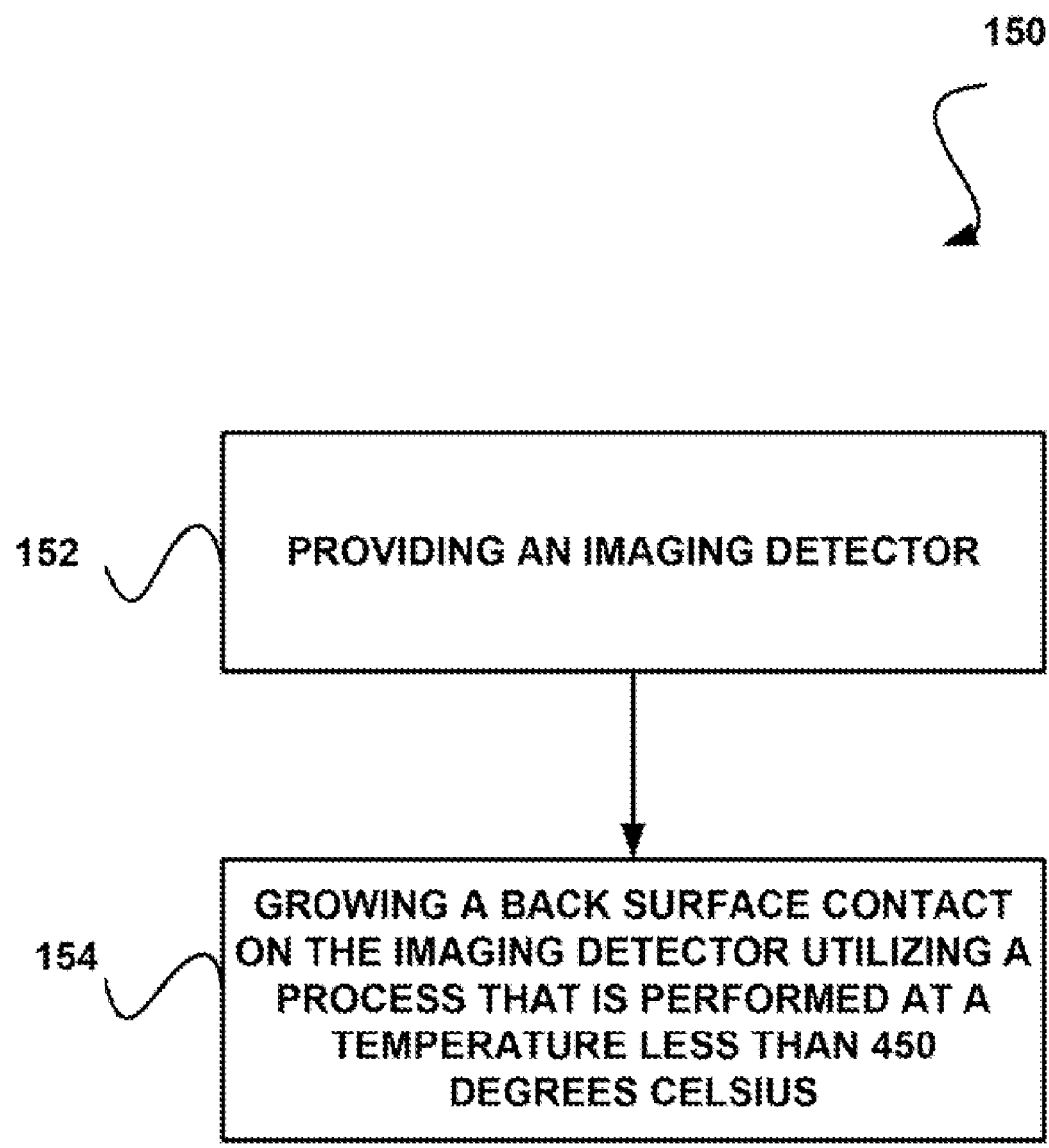
FIG. 1B shows a method for growing a back surface contact on an imaging detector, in accordance with one embodiment.

FIG. 1B shows a method 150 for growing a back surface contact on an imaging detector, in accordance with one embodiment. As shown, an imaging detector is provided. See operation 152.

In the context of the present description, an imaging detector refers to any detection or sensing device used or capable of being used in conjunction with imaging. For example, in various embodiments, the imaging detector may include, but is not limited to a charge coupled device (CCD) or CCD array, a complementary metal-oxide semiconductor (CMOS) imager, a hybrid detector, and/or any other detector that meets the above definition. Further, in the context of the present description, a hybrid detector includes two substrates fabricated under incompatible processes which are bonded together.

With continuing reference to FIG. 1B, a back surface contact is grown on the imaging detector utilizing a process that is performed at a temperature less than 450 degrees Celsius. See operation 154. In the context of the present description, a back surface contact refers to any contact or electrode deposited or grown on the back surface of an imaging detector.

In one embodiment, the imaging detector may include a fully processed detector. In particular, the aforementioned process may be performed after a front surface of the imaging detector is subject to metallization. This may be made possible in view of the fact that the aforementioned temperature range is compatible with VLSI fabrication techniques. To this end, the back surface contact may be grown utilizing a process that permits image detector fabrication to remain uninterrupted.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
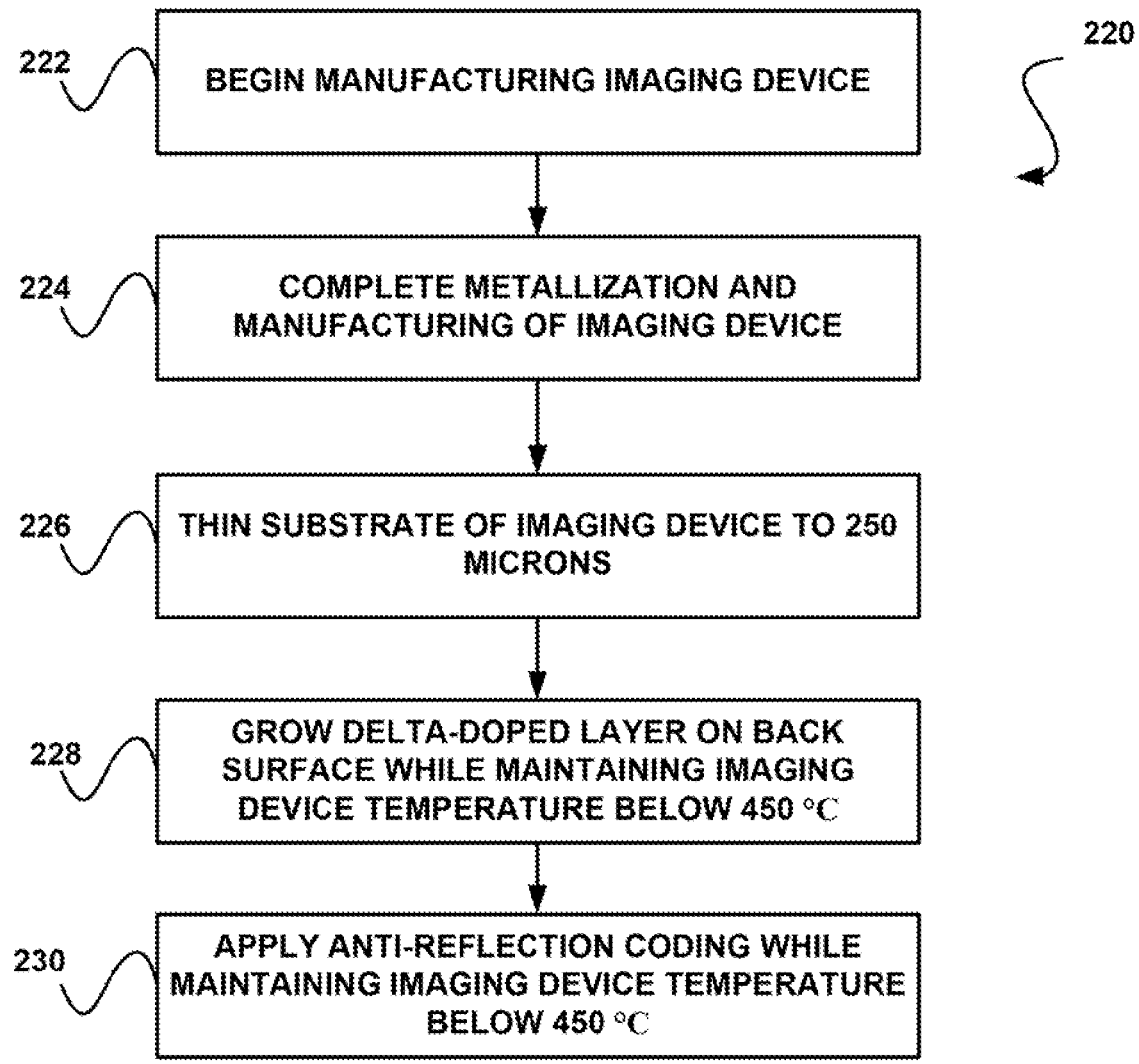
FIG. 2 shows a method for growing a back surface contact on an imaging detector, in accordance with another embodiment.

FIG. 2 shows a method 220 for growing a back surface contact on an imaging detector, in accordance with another embodiment. As an option, the present method 220 may be implemented in the context of the functionality of FIG. 1B. Of course, however, the method 220 may be carried out in any desired environment. It should also be noted that the aforementioned definitions may apply during the present description.

As shown, manufacturing of an imaging device is started. See operation 222. The manufacturing of the imaging device is then allowed to complete, including the metallization of the imaging device. See operation 224. A substrate of the imaging device is then thinned to approximately 250 microns. See operation 226. It should be noted that, in other embodiments, the imaging device may be thinned to various thicknesses and is not limited to 250 microns.

A delta-doped layer is then grown on a back surface of the imaging device while maintaining a temperature for the imaging device of less than 450° C. See operation 228. Once the delta layer has been grown, an antireflection layer may be deposited on the delta-doped layer, while maintaining a temperature for the imaging device of less than 450° C. See operation 230. It should be noted that, in another embodiment, the deposition of the antireflection layer may be omitted.

Additionally, in one embodiment, a fully fabricated imaging device including a front surface metallization may be obtained. The imaging device may be obtained as a result of a fabrication process that includes subjecting a front surface of the imaging detector to metallization, such as an aluminum metallization, for example. In this case, the method 220 may begin with the thinning of the imaging device shown in operation 226.

As mentioned earlier, the imager may include a CCD, CMOS imager, hybrid device, and/or other detection device. In one embodiment, the imager may include a high-purity silicone substrate. Additionally, in one embodiment, the delta layer may include an n-type delta-doped layer.

Strictly as an option, the n-type dopant may include antimony (Sb). In various other embodiments, any other n-type dopant may be utilized as well, such as phosphorus and arsenic. Of course, the n-type dopant may include any n-type dopant that is compatible with silicon processing which uses aluminum metallization.

The delta-doped layer may be deposited on the fully fabricated detector utilizing a molecular beam epitaxy (MBE) process. Utilizing the MBE process, nanometer scale control of placement of dopant atoms may be provided for surface modification. Furthermore, using the MBE process allows for precision control of the doping profile in a thin highly concentrated layer.

Once the delta-doped layer has been deposited, the antireflection layer may optionally be deposited on the delta-doped layer, as noted above. In one embodiment, the antireflection layer may be a double layer anti-reflection coating. In such embodiment, the double layer anti-reflection coating may include a layer of $Si_xN_y$ and a layer of $SiO_x$. Strictly as an option, the double layer anti-reflection coating may include a double layer of $Si_3N_4$ and $SiO_2$, in one specific embodiment. Of course, any suitable anti-reflection may be utilized.

One possible example of the method 220 will now be described, for illustrative purposes only. Specifically, an individual detector or imager die may be mounted in an MBE growth chamber using holders to accommodate various detector die sizes. A silicon buffer layer may then be deposited at or below 450° C. The substrate may then be cooled to 300° C. and approximately 0.4 mL of Sb may be deposited, followed by a silicon cap deposited at 300° C., at a rate of 0.04 nm/s. As an option, the silicon may be supplied by an electron-beam source at a deposition rate of 0.04 nm/s, and the Sb may be supplied by a Knudsen cell heated to 320° C. with a flux of $1.5 \times 10^{12}$ $cm^{-2}$ $s^{-1}$.

After the deposit of the delta layer, the anti-reflection coating may be deposited. Strictly as an option, anti-reflection coatings which cover a spectral range of approximately 200-1000 nm may be utilized. In order to achieve low reflectivity over the entire spectral range, two separate anti-reflection coatings may be used together to cover the visible-near infrared (NIR) and the ultra-violet (UV) visible regions.

In one embodiment, the anti-reflection coating materials may be transparent over the entire range considered, and have a refractive index between that of silicon and air. As an option, the anti-reflection coatings may be deposited by plasma enhanced chemical vapor deposition (PECVD). Continuing with the present example, the anti-reflection coatings may be deposited by PECVD at 250° C., with an overall pressure of 900 mTorr, and an RF power of 22 W. It should be noted that PECVD film stoichiometry, as well as optical properties and stress state, may depend on deposition parameters such as $N_2O/SiH_2$ ratio for oxide films, etc.

In one embodiment, a visible to NIR anti-reflection coating may be utilized and optimized for the 400-900 nm spectral range. In this case, such anti-reflection coating may include a double layer of $Si_xN_y/SiO_x$. Strictly as an option, the thickness of the double layer of $Si_xN_y/SiO_x$ may be 65 nm/93 nm. Of course, the foregoing exemplary parameters, etc. are set forth for illustrative purposes only and should not be construed as limiting in any manner.

It should be noted that the method 220 is compatible with any large scale imager (e.g. compatible with VLSI processing). It should further be noted that operations 228 and 230, may be implemented at a variety of temperatures under 450° C. For example, in one embodiment, the process may be performed at a temperature less than 300° C., 200° C., etc. Of course, various other temperature ranges under 450° C. are also contemplated.

Figure 3:
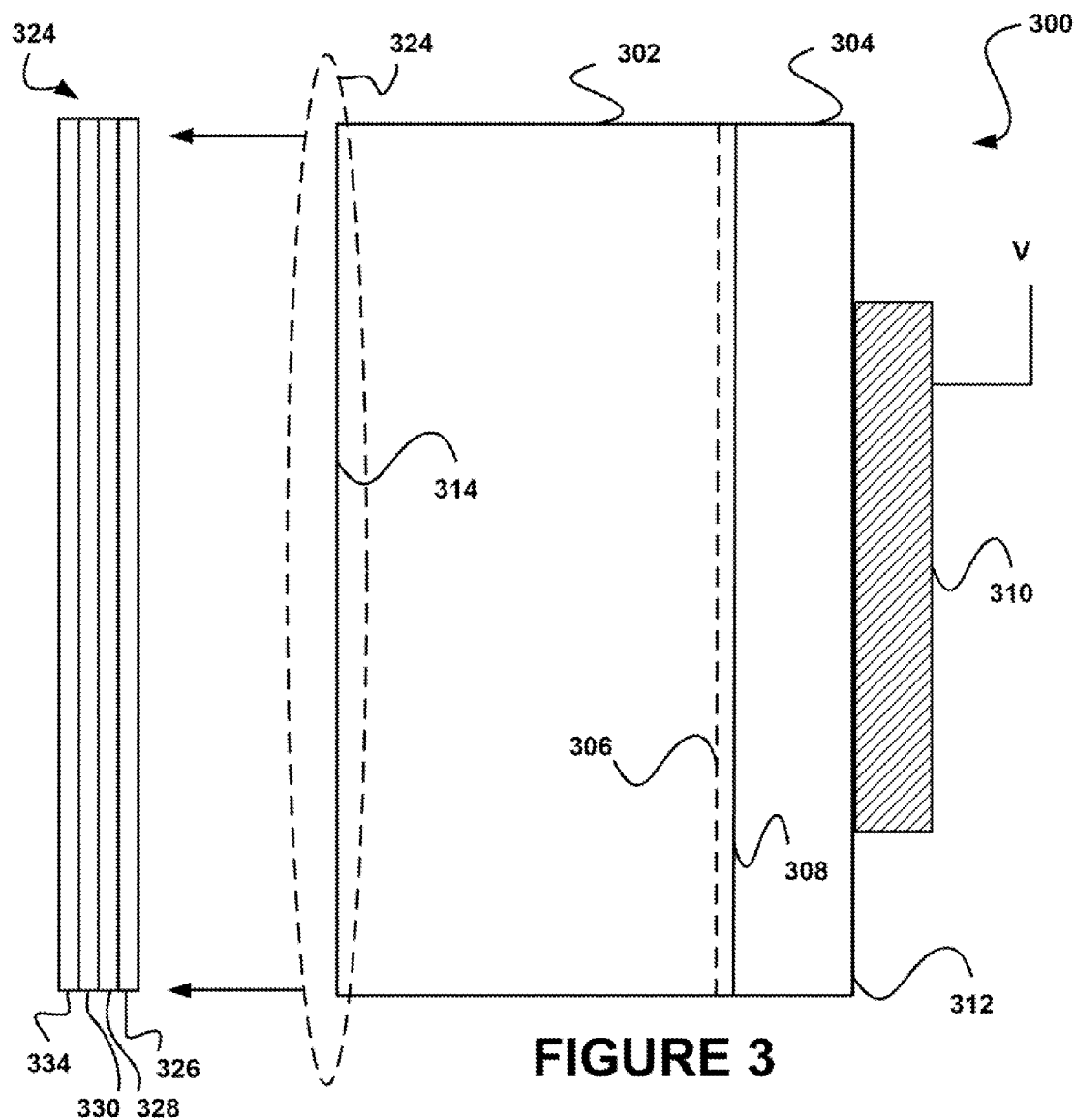
FIG. 3 shows a structure of a charge coupled device (CCD) with a back surface contact, in accordance with one embodiment.

FIG. 3 shows a structure of a CCD 300 with a back surface contact, in accordance with one embodiment. As an option, the CCD 300 may be implemented in the context of the functionality of FIGS. 1-2. Of course, however, the CCD 300 may be implemented in any desired environment. It should also be noted that the aforementioned definitions may apply during the present description.

As shown, the CCD 300 includes a semiconductor substrate 302 comprising, for example, lightly doped silicon, onto which a thin insulating layer 304 (e.g. a layer of silicon oxide) is formed. An oppositely charged dopant layer 306, for example, an n-type dopant, may be implanted on the front surface 308 of the semiconductor substrate 302 to form a "buried channel" CCD, which is described below. A conductive gate 310 is provided on the front surface 312 of the insulating layer 304 to apply an electric potential to the device.

In operation, the conductive gate 310 is biased with respect to the back surface 341 of the semiconductor substrate 302 by a voltage supply V. As photons or particles strike the device 300 through its back surface, electron-hole pairs form in the semiconductor substrate 302. Depending on whether the semiconductor is p-type or n-type, the electrons or the holes migrate toward the semiconductor-oxide surface 308, where they accumulate in a "collection well" that develops in the semiconductor substrate 302 near the semiconductor-oxide surface 308. The implanted layer 306 creates a buried channel where collected charge accumulates in the semiconductor substrate 302 a given distance below the insulating layer 304.

Incident energy from photons or particles is converted into charge in the semiconductor substrate 302, and the charge accumulates in a collection well during a given integration period. The amount of charge collected in the collection well during the integration period is generally proportional to the total energy of the particles penetrating the semiconductor substrate 302 during the integration period. The efficiency of the conversion of energy to charge depends on the energy-dependant interaction of photons or particles in the CCD 300. Therefore, different CCD structures can have markedly different efficiencies. The CCD 300 generates an output signal by serial measurement of the charge collected in each pixel during the integration period.

An MBE process may be used for growing a delta-doped layer 324 on the back surface 314 of the CCD 300. In operation, this may include depositing a thin silicon buffer layer 326, an n-type delta layer 328 (e.g. a Sb layer, etc.), and a thin silicon cap layer 330; while keeping the CCD 300 below 450° C. In one embodiment, the total thickness of the delta-doped layer may be about five nanometers, which is about one hundred layers of silicon atoms in the crystal. Of course, this is only an example as the delta-doped layer may be significantly thinner or thicker in other embodiments Additionally, an anti-reflection coating 334 may be deposited. It should be noted that, although the anti-reflection coating 334 is illustrated as a single layer, the anti-reflection coating 334 may equally include multiple layers. Furthermore, in one embodiment, the antireflection coating 334 may include $Si_xN_y$. Additionally, the antireflection coating 334 may include $SiO_x$.

As an option, the antireflection coating 334 may deposited utilizing PECVD. In one specific example, the $SiO_x$ may be deposited using 4% $SiH_2$ in $N_2$ flowing at 150 sccm (standard cubic centimeters per minute), and $N_2O$ flowing at 400 sccm. Furthermore, the $Si_xN_y$ may be deposited using 4% $SiH_2$ in $N_2$ flowing at 150 sccm, $NH_3$ flowing at 4 sccm, and $N_2$ flowing at 400 sccm. Of course, this is a very specific example and should not be construed as limiting in any manner.

In order to keep a profile of the dopant as narrow as possible, the substrate temperature may be held below 300° C. during deposition of the silicon cap layer 330 above the delta layer 328. In one embodiment, silicon surface preparation using H-termination may be utilized, which allows high quality crystalline silicon growth at low temperatures.

To this end, the process for the back electrode involves the formation of a thin highly doped layer deposited on the back surface of an imager by MBE. The resulting layer may, in one embodiment, be confined to one to several monolayers of silicon containing around $2\times10^{14}$ dopant atoms/cm$^2$. In one embodiment, an electrode may be formed as close as 1.5 nm to the back surface of the imager. Using antimony delta doping, 100% or near 100% internal quantum efficiency in CCDs may be achieved from 250-900 nm wavelengths.

Figure 4:
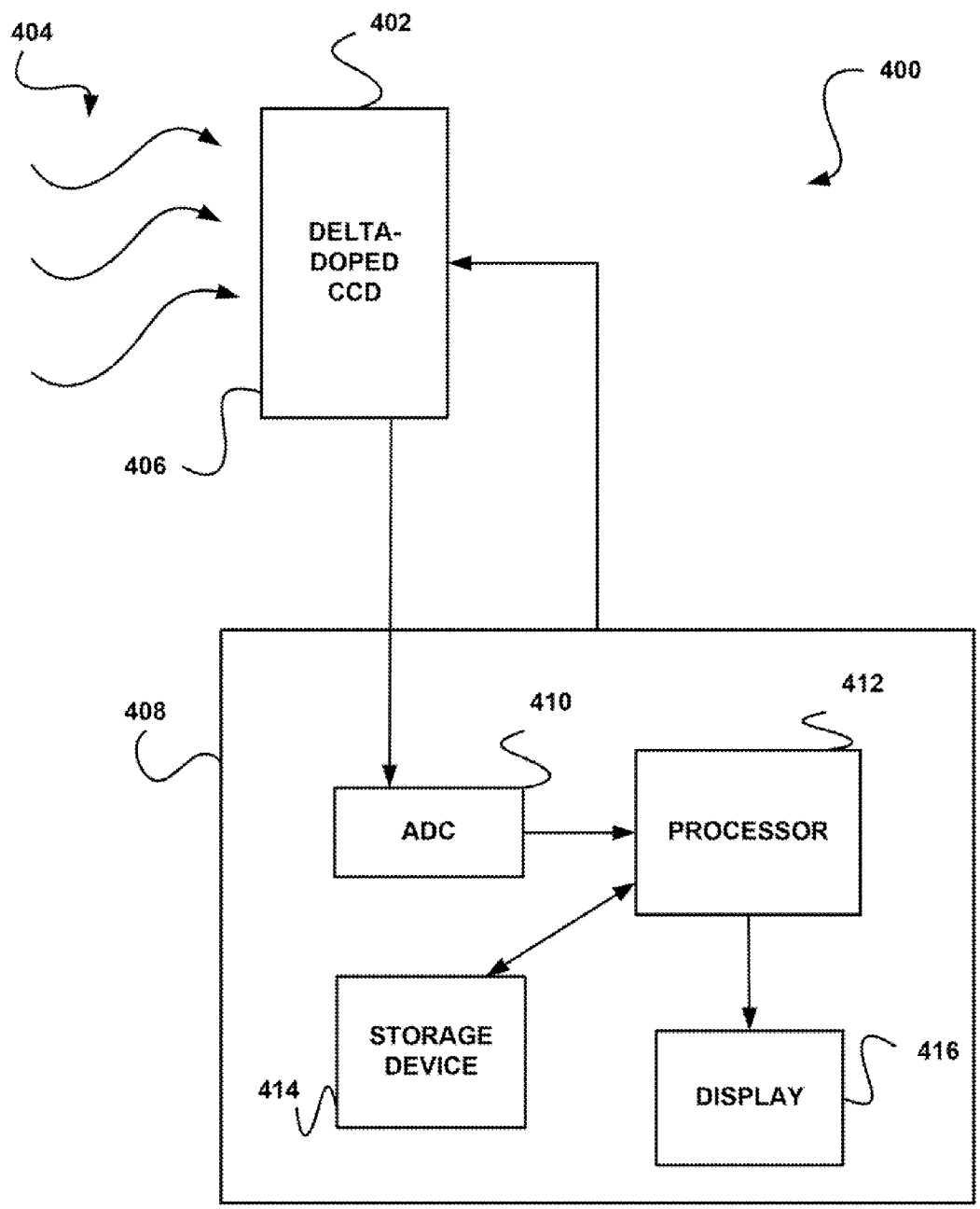
FIG. 4 shows a low-energy particle detection and imaging system using a CCD with a back surface contact, in accordance with one embodiment.

FIG. 4 shows a low-energy particle detection and imaging system 400 using a CCD with a back surface contact, in accordance with one embodiment. As an option, the present system 400 may be implemented in the context of the functionality and architecture of FIGS. 1-3. Of course, however, the system 400 may be implemented in any desired environment. Again, the aforementioned definitions may apply during the present description.

In operation, the system 400 may be used, for example, as a plasma detector to monitor solar wind. A delta-doped CCD 402 is positioned such that low-energy particles 404 penetrate a back surface 406 of the CCD 402 (i.e. back illuminated).

The particle detection system 400 includes no obstructions or elements through which the low-energy particles 404 must pass to reach the CCD 402. Unlike conventional CCD-based particle detection systems, the delta-doped system 400 may operate without the use of any particle acceleration or amplification devices, such as microchannel plates. Instead, low-energy particles may strike the back surface 406 of the delta-doped CCD 402 directly.

The CCD 402 may collect charge over a given collection interval, the length of which is determined by the particular detection application. At the end of the collection interval, a processing device, such as a digital camera 408, measures the charge at each pixel via a serial read-out process. Of course the processing device is not limited to a camera. In one embodiment, the processing device may include a computer.

The camera 408 may include an analog-to-digital converter (ADC) 410, which converts the analog output of the CCD 402 into digital data. A processor 412 uses the data, for example, to determine how many low-energy particles were received by the CCD 402 and to create an image of the particle flux. The processor 412 may optionally store the results in an electronic storage device 414 and display the image on a display device 416, such as a monitor.

While the system 400 is described in the context of a plasma detector to monitor solar wind, various other uses are contemplated. For example, the system 400 and corresponding technology may have a broad impact on NASA missions, including those designed to answer questions about the structure and evolution of the universe, dark matter, stellar astrophysics, exo-planet detection, and solar astrophysics. Furthermore, such system 400 may be used in the context of survey missions which have a need for a large number of large format detector arrays with stable, high quantum efficiency in the UV, visible, and NIR.

Additionally, the forgoing methods and corresponding systems may be applied to large format, high-purity silicon CCDs. Additional uses may include, but are not limited to highly-sensitive space plasma instruments, space weather applications, cell phone and other satellite communications, scanning electron microscopes, night vision systems, real-time image processing, surgical loops for multicolor imaging during surgery, applications in low light level situations including multicolor visible, IR, and UV imaging, and/or various other technologies.

It should be noted that the forgoing methods may apply to high purity n-type silicon-based imaging detectors, enabling broadband detection. Such methods and systems may extend detection to short wavelength light (UV to X-ray) and low energy particles (e.g. electrons, ions). Accordingly, thick, high purity silicon CCDs may be used to span a large energy range, from near IR to x-ray detection.

The foregoing systems and methods are not limited to the implementations described above. Semiconductor and dopant materials other than Si and Sb may be used, and the materials may be used in concentrations other than those suggested above. Layer thicknesses and layer structures also may vary in different embodiments. Accordingly, other embodiments are within the scope of the following claims.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   providing an imaging detector; and
   growing a delta-doped layer as a back surface contact on the imaging detector utilizing a process that is performed at a temperature less than 450 degrees Celsius;
   wherein the delta-doped layer of the imaging detector is deposited utilizing an n-type delta-doping process including:
   a) growing crystalline silicon at a temperature less than 450 degrees Celsius;
   b) interrupting the silicon growth and depositing an n-type dopant; and
   c) growing crystalline silicon at a temperature less than 300 degrees Celsius.

2. The method of claim 1, wherein the imaging detector includes a charge coupled device (CCD).

3. The method of claim 1, wherein the imaging detector includes a complimentary metal-oxide semiconductor (CMOS) imager.

4. The method of claim 1, wherein the imaging detector includes a hybrid device.

5. The method of claim 1, wherein the imaging detector is back-illuminated.

6. The method of claim 1, wherein the delta-doped layer includes an n-type doped layer.

7. The method of claim 1, wherein the delta-doped layer includes antimony.

8. The method of claim 1, wherein the delta-doped layer is deposited utilizing a molecular beam epitaxy process.

9. The method of claim 1, wherein the process further includes depositing an antireflection coating on the delta-doped layer.

10. The method of claim 9, wherein the antireflection coating includes $Si_xN_y$.

11. The method of claim 9, wherein the antireflection coating includes $SiO_x$.

12. The method of claim 9, wherein the antireflection coating is deposited utilizing a plasma-enhanced chemical vapor deposition process.

13. The method of claim 1, wherein the process is performed after a front surface of the imaging detector is subject to metallization.

14. The method of claim 13, wherein the metallization includes an aluminum metallization.

15. An apparatus, comprising:
    an imaging detector with a delta-doped layer as a back surface contact grown thereon utilizing a process that is performed at a temperature less than 450 degrees Celsius;
    wherein the delta-doped layer of the imaging detector is deposited utilizing an n-type delta-doping process including:
    a) growing crystalline silicon at a temperature less than 450 degrees Celsius;
    b) interrupting the silicon growth and depositing an n-type dopant; and
    c) growing crystalline silicon at a temperature less than 300 degrees Celsius.

16. The apparatus of claim 1, wherein the imaging detector is operable at near infra-red (NIR) wavelengths.

17. A system, comprising:
    a device; and
    an imaging detector coupled to the device, the imaging detector having a delta-doped layer as a back surface contact grown utilizing a process that is performed at a temperature less than 450 degrees Celsius;
    wherein the delta-doped layer of the imaging detector is deposited utilizing an n-type delta-doping process including:
    a) growing crystalline silicon at a temperature less than 450 degrees Celsius;
    b) interrupting the silicon growth and depositing an n-type dopant; and
    c) growing crystalline silicon at a temperature less than 300 degrees Celsius.

* * * * *